United States Patent
Seo et al.

(10) Patent No.: US 9,876,151 B2
(45) Date of Patent: Jan. 23, 2018

(54) SOLID-STATE LIGHT-EMITTING ELEMENT, LIGHT-EMITTING DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Hisao Ikeda, Kanagawa (JP); Takuya Kawata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/164,051

(22) Filed: May 25, 2016

(65) Prior Publication Data

US 2016/0343920 A1   Nov. 24, 2016

Related U.S. Application Data

(60) Continuation of application No. 14/505,843, filed on Oct. 3, 2014, now Pat. No. 9,356,209, which is a
(Continued)

(30) Foreign Application Priority Data

Sep. 14, 2010   (JP) ................................. 2010-205790

(51) Int. Cl.
*H01L 33/00* (2010.01)
*H01L 33/58* (2010.01)
(Continued)

(52) U.S. Cl.
CPC .............. *H01L 33/58* (2013.01); *H01L 33/22* (2013.01); *H01L 33/56* (2013.01); *H01L 51/5275* (2013.01)

(58) Field of Classification Search
CPC .......... H01L 33/22; H01L 33/58; H01L 33/56; H01L 51/5275
(Continued)

(56) References Cited

U.S. PATENT DOCUMENTS 5,107,175 A   4/1992   Hirano et al.
5,124,204 A   6/1992   Yamashita et al.
(Continued)

FOREIGN PATENT DOCUMENTS

CN   001719955 A   1/2006
CN   101060165 A   10/2007
(Continued)

OTHER PUBLICATIONS

Reineke, S. et al., "White Organic Light-Emitting Diodes with Fluorescent Tube Efficiency," Nature, May 14, 2009, vol. 459, pp. 234-239.
(Continued)

*Primary Examiner* — Thien F Tran
(74) *Attorney, Agent, or Firm* — Husch Blackwell LLP

(57) ABSTRACT

A solid-state light-emitting element includes a structure body having a property of transmitting visible light and an uneven structure on each of the top side and the bottom side thereof; a high refractive index material layer provided on one surface of the structure body; and a light-emitting body with a refractive index of greater than or equal to 1.6 provided over the high refractive index material layer. One surface of the high refractive index material layer is flatter than the other surface thereof which is in contact with the structure body. The refractive index of the high refractive index material layer is greater than or equal to 1.6. The refractive index of the structure body is greater than 1.0 and less than that of the high refractive index material layer.

18 Claims, 6 Drawing Sheets

Related U.S. Application Data division of application No. 13/231,278, filed on Sep. 13, 2011, now Pat. No. 8,853,724.

(51) Int. Cl.
  *H01L 51/52* (2006.01)
  *H01L 33/22* (2010.01)
  *H01L 33/56* (2010.01)

(58) Field of Classification Search
  USPC ...................................................... 257/98, 79
  See application file for complete search history.

(56) References Cited

U.S. PATENT DOCUMENTS

| | | |
|---|---|---|
| 5,189,405 A | 2/1993 | Yamashita et al. |
| 5,686,360 A | 11/1997 | Harvey et al. |
| 5,693,956 A | 12/1997 | Shi et al. |
| 5,757,126 A | 5/1998 | Harvey et al. |
| 5,771,562 A | 6/1998 | Harvey et al. |
| 5,811,177 A | 9/1998 | Shi et al. |
| 5,952,778 A | 9/1999 | Haskal et al. |
| 6,146,225 A | 11/2000 | Sheats et al. |
| 6,150,187 A | 11/2000 | Zyung et al. |
| 6,198,217 B1 | 3/2001 | Suzuki et al. |
| 6,198,220 B1 | 3/2001 | Jones et al. |
| 6,268,695 B1 | 7/2001 | Affinito |
| 6,413,645 B1 | 7/2002 | Graff et al. |
| 6,771,021 B2 | 8/2004 | Cok |
| 6,965,195 B2 | 11/2005 | Yamazaki et al. |
| 7,291,969 B2 | 11/2007 | Tsutsui |
| 7,663,312 B2 | 2/2010 | Anandan |
| 7,674,407 B2 | 3/2010 | Takakuwa et al. |
| 7,755,097 B2 | 7/2010 | Kim |
| 7,859,627 B2 | 12/2010 | Nishida et al. |
| 8,003,993 B2 | 8/2011 | Cho et al. |
| 8,004,003 B2 | 8/2011 | Kim |
| 8,154,193 B2 | 4/2012 | Tsutsui |
| 8,339,036 B2 | 12/2012 | Tsutsui |
| 8,529,114 B2 | 9/2013 | Nishiwaki |
| 8,530,916 B2 | 9/2013 | Nakamura et al. |
| 8,624,284 B2 | 1/2014 | Ikeda et al. |
| 8,728,360 B2 | 5/2014 | Mimura et al. |
| 8,853,724 B2 * | 10/2014 | Seo .................... H01L 51/5275 257/98 |
| 8,890,404 B2 | 11/2014 | Tsutsui |
| 9,209,419 B2 | 12/2015 | Tsutsui |
| 2001/0035713 A1 | 11/2001 | Kimura |
| 2004/0027059 A1 | 2/2004 | Tsutsui |
| 2004/0217702 A1 | 11/2004 | Garner et al. |
| 2005/0199599 A1 | 9/2005 | Li et al. |
| 2005/0221521 A1 | 10/2005 | Lee et al. |
| 2005/0258436 A1 | 11/2005 | Arai |
| 2006/0007552 A1 | 1/2006 | Takakuwa et al. |
| 2006/0237735 A1 | 10/2006 | Naulin et al. |
| 2007/0222372 A1 | 9/2007 | Cok et al. |
| 2007/0254162 A1 | 11/2007 | Kozaki et al. |
| 2008/0018231 A1 | 1/2008 | Hirakata |
| 2008/0121918 A1 | 5/2008 | Denbaars et al. |
| 2008/0129184 A1 | 6/2008 | Nishida et al. |
| 2008/0129933 A1 | 6/2008 | Nishida et al. |
| 2008/0130122 A1 | 6/2008 | Egi et al. |
| 2008/0213931 A1 | 9/2008 | Asabe |
| 2009/0015142 A1 | 1/2009 | Potts et al. |
| 2010/0013372 A1 | 1/2010 | Oikawa et al. |
| 2010/0019664 A1 | 1/2010 | Mishima |
| 2010/0046236 A1 | 2/2010 | Nishiwaki |
| 2010/0090234 A1 | 4/2010 | Cho et al. |
| 2010/0110551 A1 | 5/2010 | Lamansky et al. |
| 2010/0295443 A1 | 11/2010 | Roberts et al. |
| 2011/0012139 A1 | 1/2011 | Yamamoto |
| 2011/0134647 A1 | 6/2011 | Nishida et al. |
| 2011/0147777 A1 | 6/2011 | Konno et al. |
| 2011/0241051 A1 | 10/2011 | Carter et al. |

FOREIGN PATENT DOCUMENTS

| | | |
|---|---|---|
| CN | 101578537 A | 11/2009 |
| EP | 1 388 904 A2 | 2/2004 |
| EP | 1 848 050 A2 | 10/2007 |
| EP | 2 065 950 A2 | 6/2009 |
| EP | 2 203 030 A1 | 6/2010 |
| EP | 2 278 855 A1 | 1/2011 |
| EP | 2 324 990 A1 | 5/2011 |
| EP | 2 432 039 A1 | 3/2012 |
| JP | 08-248207 A | 9/1996 |
| JP | 2000-231007 A | 8/2000 |
| JP | 2002-299039 A | 10/2002 |
| JP | 2004-069790 A | 3/2004 |
| JP | 2006-098747 A | 4/2006 |
| JP | 2006-147203 A | 6/2006 |
| JP | 2007-173424 A | 7/2007 |
| JP | 2008-066027 A | 3/2008 |
| JP | 2008-098083 A | 4/2008 |
| JP | 2008-112592 A | 5/2008 |
| JP | 2009-076452 A | 4/2009 |
| JP | 2009-093190 A | 4/2009 |
| JP | 2009-146654 A | 7/2009 |
| JP | 2009-210798 A | 9/2009 |
| JP | 2009-217292 A | 9/2009 |
| JP | 2010-176928 A | 8/2010 |
| JP | 2012-507110 | 3/2012 |
| KR | 2012-0028827 A | 3/2012 |
| TW | I272874 B | 2/2007 |
| TW | 200913767 | 3/2009 |
| TW | 200950174 | 12/2009 |
| WO | WO 2009/011961 A2 | 1/2009 |
| WO | WO 2010/021133 A1 | 2/2010 |
| WO | WO 2010/038005 A2 | 4/2010 |

OTHER PUBLICATIONS

European Search Report re Application No. EP 11180297.1, dated Jan. 12, 2012.

Chinese Office Action re Application No. CN 201110283326.6, dated Mar. 13, 2015.

Taiwanese Office Action re Application No. TW 100130486, dated Nov. 20, 2015.

Taiwanese Office Action re Application No. TW 105111847, dated Aug. 30, 2016.

* cited by examiner

SOLID-STATE LIGHT-EMITTING ELEMENT, LIGHT-EMITTING DEVICE, AND LIGHTING DEVICE

This application is a continuation of U.S. application Ser. No. 14/505,843, filed on Oct. 3, 2014 which is a divisional of U.S. application Ser. No. 13/231,278, filed on Sep. 13, 2011 (now U.S. Pat. No. 8,853,724 issued Oct. 7, 2014), which are all incorporated herein by reference.

BACKGROUND OF THE INVENTION

1. Field of the Invention

The present invention relates to a solid-state light-emitting element, a light-emitting device including the light-emitting element, and a lighting device including the light-emitting device.

2. Description of the Related Art

A solid-state light-emitting element emits light in a region with a higher refractive index than the air; thus, the solid-state light-emitting element has a problem that the light extraction efficiency thereof is lower than 100% due to the condition by which total reflection occurs at the interface between the region with a high refractive index and the air when light is extracted to the air.

In order to solve the problem, a light-emitting element in which an uneven structure body with a high refractive index is provided on a surface of a region with a high refractive index of a solid-state light-emitting element to extract light to the air side, or the like has been reported.

For example, in Non-Patent Document 1, as a means for improving light extraction efficiency of a light-emitting element, a structure in which a high refractive index glass substrate and a high refractive index lens are combined and a structure in which an uneven structure is provided at the interface between a high refractive index glass substrate and the air are employed.

[Non-Patent Document 1] *White organic light-emitting diodes with fluorescent tube efficiency*, Nature, May 14, 2009, Vol. 459, pp. 234-239

SUMMARY OF THE INVENTION

However, there are few kinds of materials which transmit visible light and have a high refractive index (e.g., glass and resin) and such materials are expensive. Therefore, the structures described in Non-Patent Document 1 have a problem of high manufacturing cost.

Therefore, an object of one embodiment of the present invention is to provide a solid-state light-emitting element that is inexpensive and has high light extraction efficiency. In addition, an object of one embodiment of the present invention is to provide a light-emitting device including the solid-state light-emitting element or a lighting device including the light-emitting device.

In order to achieve the objects, the present inventors focused on the use amount of material with a high refractive index. A structure is preferably employed in which a thin material layer with a refractive index of greater than or equal to 1.6 is provided in contact with a light-emitting body, a support with a refractive index of greater than 1.0 and less than that of the material layer is provided in contact with the material layer, and each of the interface between the material layer and the support and the interface between the support and the air is uneven.

With such a structure, light entering a medium with a low refractive index from a medium with a high refractive index at an incident angle exceeding a critical angle is totally reflected, a decrease in light extraction efficiency can be suppressed, and an inexpensive solid-state light-emitting element can be provided.

Therefore, one embodiment of the present invention is a solid-state light-emitting element including a structure body which has a property of transmitting visible light and an uneven structure on each of the top side and the bottom side thereof; a high refractive index material layer provided on one surface of the structure body; and a light-emitting body including a light-emitting region with a refractive index of greater than or equal to 1.6 which is provided over the high refractive index material layer. One surface of the high refractive index material layer is flatter than the other surface thereof which is in contact with the structure body. The refractive index of the high refractive index material layer is greater than or equal to 1.6. The refractive index of the structure body is greater than 1.0 and less than that of the high refractive index material layer.

Further, one embodiment of the present invention is a solid-state light-emitting element including a structure body which has a property of transmitting visible light and an uneven structure on each of the top side and the bottom side thereof; a high refractive index material layer provided on one surface of the structure body; a first electrode provided over the high refractive index material layer; a layer containing a light-emitting substance which is provided over the first electrode; and a second electrode provided over the layer containing a light-emitting substance. One surface of the high refractive index material layer is flatter than the other surface thereof which is in contact with the structure body. The refractive index of each of the high refractive index material layer, the first electrode, and the layer containing a light-emitting substance is greater than or equal to 1.6. The refractive index of the structure body is greater than 1.0 and less than that of the high refractive index material layer.

The solid-state light-emitting element with the structure is preferable for the following reason: a contact surface of the high refractive index material layer and the first electrode is flat; thus, even in the case where the solid-state light-emitting element is an organic EL element, the first electrode can be formed to be flat, generation of leakage current through the organic EL element due to unevenness of the first electrode can be suppressed, and high reliability can be obtained.

Further, it is preferable that the solid-state light-emitting element include a nitride film with a refractive index of greater than or equal to 1.6 between the high refractive index material layer and the first electrode.

When the nitride film with a refractive index of greater than or equal to 1.6 is provided between the high refractive index material layer and the first electrode in the solid-state light-emitting element, diffusion of impurities into the light-emitting body can be prevented without decreasing light extraction efficiency. For example, the solid-state light-emitting element with the structure is preferable for the following reason: an EL layer can be protected from entry of moisture contained in the structure body or the high refractive index material layer even in the case where the solid-state light-emitting element is an organic EL element.

Further, in the solid-state light-emitting element, the refractive index of the structure body is preferably greater than or equal to 1.3 and less than that of the high refractive index material layer.

Further, in the solid-state light-emitting element, the refractive index of the high refractive index material layer is preferably greater than or equal to 1.7.

Further, in the solid-state light-emitting element, the structure body may include a plurality of layers. In the case where the structure body includes a plurality of layers, the difference in the refractive index between these layers is preferably less than or equal to 0.15, in which case reflection of light due to the difference in the refractive index can be reduced to 1% or less. Moreover, the difference in the refractive index is more preferably less than or equal to 0.10.

For example, the structure body can have a structure in which a first layer in contact with the high refractive index material layer and a second layer one surface of which is in contact with the first layer are provided; the difference in the refractive index between the first layer and the second layer is less than or equal to 0.15; the first layer has an uneven structure on the surface in contact with the high refractive index material layer; and the second layer has an uneven structure on the other surface.

Further, the structure body can have a structure in which a first layer in contact with the high refractive index material layer, a second layer in contact with the first layer, and a third layer in contact with the second layer are provided; the difference in the refractive index between the first layer, the second layer, and the third layer is less than or equal to 0.15; the first layer has an uneven structure on the surface in contact with the high refractive index material layer; and the third layer has an uneven structure on the surface opposite to the surface in contact with the second layer.

One embodiment of the present invention is a light-emitting device including the solid-state light-emitting element. In addition, one embodiment of the present invention is a lighting device including the light-emitting device.

According to one embodiment of the present invention, a solid-state light-emitting element which is inexpensive and has high light extraction efficiency can be provided. Further, a light-emitting device including the solid-state light-emitting element or a lighting device including the light-emitting device can be provided.

DETAILED DESCRIPTION OF THE INVENTION

Figure 1A:
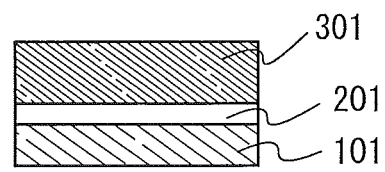
FIGS. 1A and 1B each illustrate an example of a solid-state light-emitting element that is one embodiment of the present invention.

Embodiments and examples will be described in detail with reference to the drawings. Note that the present invention is not limited to the description below, and it is easily understood by those skilled in the art that various changes and modifications can be made without departing from the spirit and scope of the present invention. Therefore, the present invention should not be construed as being limited to the description in the embodiments and examples. Note that in the structures of the present invention described below, the same portions or portions having similar functions are denoted by the same reference numerals in different drawings, and description of such portions is not repeated.

(Embodiment 1)

In this embodiment, a solid-state light-emitting element that is one embodiment of the present invention will be described with reference to FIGS. 1A and 1B and FIGS. 2A to 2F.

A solid-state light-emitting element illustrated in FIG. 1A includes a structure body 101, a high refractive index material layer 201, and a light-emitting body 301.

The structure body 101 has a property of transmitting visible light (hereinafter, simply a "light-transmitting property") and an uneven structure on each of the top side and the bottom side thereof. Although an uneven structure in a striped form is effective, an uneven structure in a matrix is preferable. The refractive index of the structure body 101 is greater than 1.0 and less than the refractive index of the high refractive index material layer 201. In particular, it is preferable that the refractive index of the structure body 101 be greater than or equal to 1.3 and less than that of the high refractive index material layer 201.

FIGS. 2A to 2F illustrate examples of the structure body 101 included in the solid-state light-emitting element of one embodiment of the present invention.

Figure 2A:
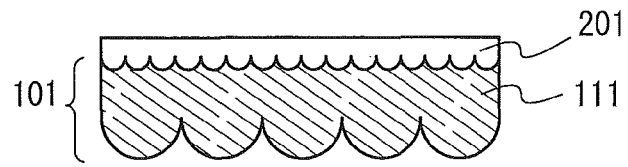
FIGS. 2A to 2F illustrate examples of a structure body according to Embodiment.
Figure 2B:
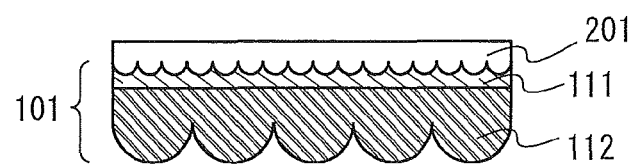
Figure 2C:
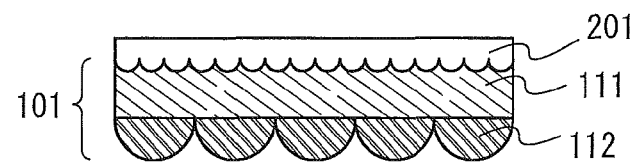
Figure 2D:
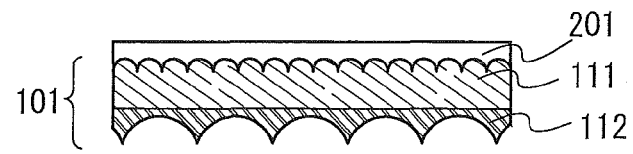
Figure 2E:
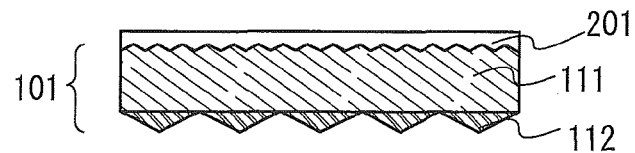

Each of the structure bodies 101 illustrated in FIGS. 2A to 2F has an uneven structure on each of the top side and the bottom side thereof. The pattern of the uneven structure of the structure body 101 is not particularly limited. The uneven structure can have, for example, a hemispherical pattern (FIGS. 2A to 2D and 2F), or a pattern with an apex such as a circular cone and a pyramid (e.g., a triangular pyramid or a square pyramid) (FIG. 2E).

The size and height of the unevenness of the uneven structure on the side where the structure body 101 is in contact with the high refractive index material layer 201 is preferably about 0.1 μm to 100 μm. The size and height of the unevenness on the opposite side is preferably about 0.1 μm to 1000 μm. The size of the uneven structure on the side where the structure body 101 is in contact with the high refractive index material layer 201 affects the amount of material used for the high refractive index material layer 201, which narrows the allowable range of the size and height of the unevenness. In contrast, the uneven structure on the opposite side may have a size or height exceeding 1000 μm. In particular, the unevenness on both sides preferably has a size or height of greater than or equal to 1 μm, in which case influence of interference of light can be reduced.

It is preferable that patterns be provided so that a space is not formed between adjacent patterns. For example, it is preferable that patterns be arranged in a closest-packed structure. A regular hexagon is given as an example of a preferable base shape.

The structure body 101 may be formed using one kind of material as illustrated in FIG. 2A or a stacked layer of a plurality of materials as illustrated in FIGS. 2B to 2F. In the case where the structure body 101 is formed using a plurality of layers, the plurality of layers may have different refractive indexes.

In the case where the structure body 101 has different refractive indexes depending on the layers, the difference in the refractive index of all the layers is preferably less than or equal to 0.15, in which case reflection of light due to the difference in refractive index can be reduced to 1% or less.

The difference in the refractive index of all the layers is more preferably less than or equal to 0.10; the smaller the difference in the refractive index between the layers included in the structure body 101 is, the more reflection of light due to the difference in the refractive index can be reduced.

In the case where the structure body includes a plurality of layers with different refractive indexes, when the refractive index of one of two adjacent layers on the high refractive index material layer 201 side is greater than that of the other layer on the side where light is extracted, an uneven structure is preferably provided at an interface between the two layers.

Further, the case where the refractive index of one of two adjacent layers included in the structure body 101 on the high refractive index material layer 201 side is less than or equal to that of the other layer on the side where light is extracted is convenient, in which case a step of providing an uneven structure is not needed.

Of layers included in the structure body 101, the layer which is in contact with the high refractive index material layer 201 preferably has the lowest refractive index for the following reason: total reflection can be suppressed at interfaces between the layers included in the structure body 101, which results in an increase in light extraction efficiency.

The structure body 101 illustrated in FIG. 2A includes only a first layer 111. The first layer 111 may be formed using a material whose refractive index is greater than 1.0 and less than the refractive index of the high refractive index material layer 201.

As examples of the material that can be used for the first layer 111, glass, a resin, and the like whose refractive index is greater than 1.0 and less than 1.6 are given. As the resin, a polyester resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, or the like can be used. In particular, a material whose refractive index is greater than or equal to 1.4 and less than 1.6 is preferably used.

As a method for forming an uneven structure in the above material, for example, an etching method, a sand blasting method, a microblast processing method, a droplet discharge method, a printing method (screen printing or offset printing by which a pattern is formed), a coating method such as a spin coating method, a dipping method, a dispenser method, an imprint method, a nanoimprint method, or the like can be employed as appropriate.

The structure bodies 101 illustrated in FIGS. 2B to 2E each include the first layer 111 and a second layer 112. The first layer 111 has a pattern on a surface in contact with the high refractive index material layer 201. The second layer 112 has a pattern on a surface opposite to a surface in contact with the first layer 111.

The first layer 111 in each of the structure bodies 101 illustrated in FIGS. 2C to 2E can be formed using any of the above materials and methods. Further, the second layer 112 can be formed using a hemispherical lens, a micro lens array, a film provided with an uneven structure, a light diffusing film, or the like as well as the materials and methods that can be used for the first layer 111. For example, the above lens or film is attached to the first layer 111 with the use of an adhesive whose refractive index is substantially the same as that of the first layer 111 or the above lens or film, so that the second layer 112 can be formed.

The first layer 111 in the structure body 101 illustrated in FIG. 2B can be formed using a material and a method that are similar to those of the second layers 112 illustrated in FIGS. 2C to 2E. The second layer 112 can be formed using a material and a method that are similar to those of the first layers 111 illustrated in FIGS. 2C to 2E.

In the case where a structure body includes two layers as in the case of the structure bodies 101 illustrated in FIGS. 2B to 2E, the difference in the refractive index between the first layer 111 and the second layer 112 is preferably less than or equal to 0.15. The smaller the difference in the refractive index between the layers included in the structure body 101 is, the more reflection of light due to the difference in the refractive index can be reduced. Further, the refractive index of the first layer 111 is preferably less than that of the second layer 112, in which case loss of light due to total reflection at the interface between the first layer 111 and the second layer 112, or the like can be reduced and light extraction efficiency can be increased.

Figure 2F:
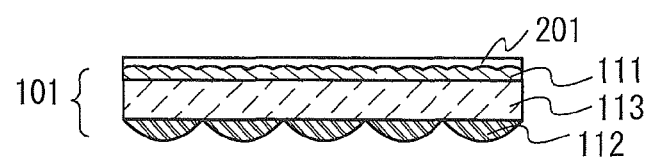

The structure body 101 illustrated in FIG. 2F includes the first layer 111, the second layer 112, and the third layer 113. The first layer 111 has an uneven structure on a surface in contact with the high refractive index material layer 201. The second layer 112 has an uneven structure on a surface opposite to a surface in contact with a third layer 113. Each of the first layer 111 and the second layer 112 can be formed using a material and a method that are similar to those in the cases of FIGS. 2C to 2E.

In the structure body 101 illustrated in FIG. 2F, at least the third layer 113 may have a function as a support. Therefore, the first layer 111 and the second layer 112 are preferably formed to be thin and can be formed using a material having optical characteristics that are necessary, which is selected as appropriate. The first layer 111 and the second layer 112 are each preferably formed to a thickness of about several tens of micrometers, and may be formed to a thickness greater than or equal to several tens of micrometers if needed.

The third layer 113 can be formed without a process of forming unevenness, and thus can be formed using an inexpensive material or a readily available material as appropriate selected from the above glass or resin without considering the processability. For example, a resin is preferable because of ease of reuse as well as light weight and resistance to breakage.

In the case where a structure body includes three layers as in the case of the structure body 101 illustrated in FIG. 2F, the difference in the refractive index between the three layers is preferably less than or equal to 0.15. The smaller the difference in the refractive index between the three layers is, the more reflection of light due to the difference in the refractive index can be reduced.

Further, it is preferable that the refractive index of the first layer 111 be the lowest, the refractive index of the second layer 112 be greater than or equal to that of the first layer 111, and the refractive index of the third layer 113 be greater than or equal to that of the second layer 112 for the following reason: loss of light due to total reflection at the interface between the first layer 111 and the second layer 112 and the interface between the second layer 112 and the third layer 113, or the like can be reduced, which results in an increase in light extraction efficiency.

Note that although a pattern on a surface of the structure body 101 which is in contact with the high refractive index material layer 201 is formed before the high refractive index material layer 201 is provided, the time of formation of a pattern on a surface on the opposite side (the side where light is extracted) is not limited. The pattern on the surface on the opposite side may be formed before the high refractive index material layer 201 is provided or after the high refractive index material layer 201, a light-emitting layer, or the like is provided over the structure body 101. It is preferable that the pattern be formed on the surface on the side where light is extracted after a layer included in a solid-state light-emitting element is formed (or after a light-emitting body or the like is sealed), in which case the pattern can be prevented from being broken during a formation process of the high refractive index material layer 201, the light-emitting body, or the like or during transfer.

The high refractive index material layer 201 is formed of high refractive index glass, a liquid, or a resin. The high refractive index material layer 201 has a light-transmitting property. The refractive index of the high refractive index material layer 201 is greater than or equal to 1.6, preferably greater than or equal to 1.7 and less than or equal to 2.1. As examples of a resin with a high refractive index, a resin containing bromine, a resin containing sulfur, and the like are given. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used. As a liquid with a high refractive index, a contact liquid (refractive liquid) containing sulfur and methylene iodide, or the like can be used. Any of a variety of methods suitable for the material may be employed for forming the high refractive index material layer 201. For example, any of the above resins is deposited by a spin coating method and is cured by heat or light, so that the high refractive index material layer 201 can be formed. The material and the deposition method can be selected as appropriate in consideration of the adhesion strength, ease of processing, or the like.

In general, a resin with a high refractive index is expensive. However, the high refractive index material layer 201 in a solid-state light-emitting element of one embodiment of the present invention may be formed to be as thin as several tens of micrometers. Therefore, a solid-state light-emitting element which is inexpensive and has high light extraction efficiency can be manufactured at low cost.

Figure 1B:
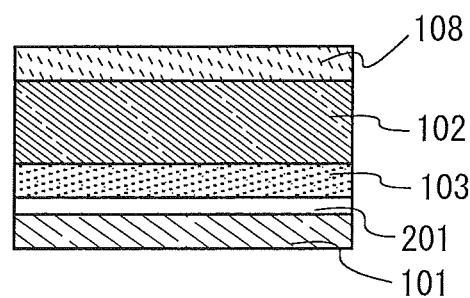

The light-emitting body 301 can be formed using a material whose refractive index is greater than or equal to 1.6, such as a light-emitting diode (LED), an organic electroluminescent (EL) element, or an inorganic EL element. FIG. 1B illustrates a solid-state light-emitting element in which organic EL is used for the light-emitting body 301.

The solid-state light-emitting element illustrated in FIG. 1B includes the structure body 101, the high refractive index material layer 201, a first electrode 103, an EL layer 102 containing a light-emitting substance, and a second electrode 108.

In FIG. 1B, the surface of the high refractive index material layer 201 which is in contact with the first electrode 103 is flatter than the surface of the high refractive index material layer 201 which is in contact with the structure body 101. Thus, generation of leakage current through the EL layer 102 can be suppressed.

As described above, in the solid-state light-emitting element of this embodiment, the thin high refractive index material layer with a refractive index of greater than or equal to 1.6 is provided between the support and the light-emitting body. Furthermore, the uneven structures are provided at the interface between the support and the air and the interface between the support and the layer with a high refractive index.

Such a structure makes it possible to reduce the use amount of expensive high refractive index material and to realize a solid-state light-emitting element which is inexpensive and has high light extraction efficiency.

This embodiment can be combined as appropriate with any of the other embodiments in this specification.

(Embodiment 2)

In this embodiment, an example of a solid-state light-emitting element of one embodiment of the present invention will be described. In this embodiment, an organic EL element will be described as an example with reference to FIGS. 3A to 3C.

Figure 3A:
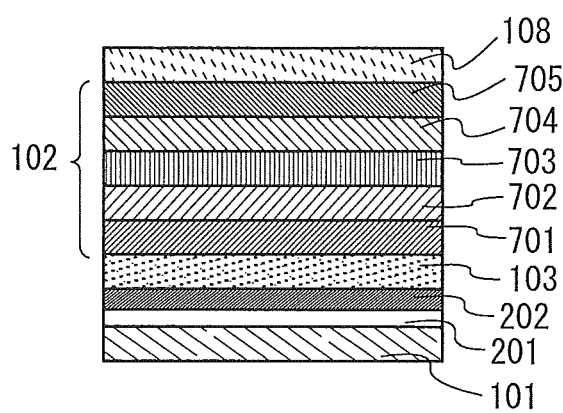
FIGS. 3A to 3C illustrate examples of an organic EL element according to Embodiment.

A light-emitting element illustrated in FIG. 3A includes a high refractive index material layer 201 over a structure body 101, a nitride film 202 over the high refractive index material layer 201, a first electrode 103 over the nitride film 202, an EL layer 102 over the first electrode 103, and a second electrode 108 over the EL layer 102.

The EL layer 102 may include at least a light-emitting layer containing a light-emitting organic compound. In addition, the EL layer 102 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In FIG. 3A, in the EL layer 102, a hole-injection layer 701, a hole-transport layer 702, a light-emitting layer 703, an electron-transport layer 704, and an electron-injection layer 705 are stacked in this order from the first electrode 103 side. Further, in this embodiment, the refractive index of the EL layer 102 is greater than or equal to 1.7.

The nitride film 202 is preferably provided because it has an effect of protecting a pair of electrode layers (the first electrode 103 and the second electrode 108) and the EL layer 102 which are formed later from moisture contained in the structure body 101 and the high refractive index material layer 201. The nitride film 202 has a light-transmitting property.

A manufacturing method of the light-emitting element illustrated in FIG. 3A will be described.

First, the structure body 101 is prepared. The structure described in Embodiment 1 can be employed for the structure body 101. In this embodiment, a fluorine resin film with a refractive index of 1.36 is formed on one surface of a glass substrate with a refractive index of 1.5 and an uneven structure is formed by an imprinting method. The fluorine resin film may be formed to a thickness of several tens of micrometers. The other surface is provided with an uneven structure after the pair of electrode layers and the EL layer 102 are formed. The detailed description thereof will be given later.

The structure body 101 is provided with the uneven structure on the side where light is extracted, whereby light in the substrate mode, which has been conventionally guided in the structure body 101, can be extracted outside. Thus, the light extraction efficiency can be increased.

Next, the high refractive index material layer 201 is formed over the structure body 101. The high refractive index material layer 201 can be formed using any of the materials described in Embodiment 1.

Since the structure body 101 is provided with the uneven structure, light in the waveguide mode, which has been conventionally guided in the EL layer, can be extracted outside. Thus, the light extraction efficiency can be increased.

The surface of the high refractive index material layer 201 (here, the surface in contact with the nitride film 202) is flatter than the other surface which is in contact with the structure body 101. Thus, generation of leakage current through the EL layer 102 which is formed later can be suppressed and high reliability can be obtained.

Next, the nitride film 202 with a refractive index of greater than or equal to 1.6 is formed over the high refractive index material layer 201. As the nitride film 202, for example, a silicon nitride film, a silicon nitride oxide film, an aluminum nitride film, or the like can be used. Providing the nitride film 202 makes it possible to prevent diffusion of impurities into the light-emitting element without decreasing the light extraction efficiency. For example, the EL layer 102 can be protected from entry of moisture from the structure body 101 or the high refractive index material layer 201, and a reduction in the lifetime of the light-emitting element can be suppressed.

Next, the first electrode 103 is formed over the nitride film 202. The first electrode 103 is provided in the side in which light is extracted from the EL layer 102, and thus is formed using a light-transmitting material.

As the light-transmitting material, indium oxide, indium tin oxide (also referred to as ITO), indium zinc oxide (also referred to as IZO), zinc oxide, zinc oxide to which gallium is added, or the like can be used.

In addition, as the first electrode 103, a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 103 may be thinned so as to transmit light.

Next, the EL layer 102 is formed over the first electrode 103. In FIG. 3A, the EL layer 102 includes the hole-injection layer 701, the hole-transport layer 702, the light-emitting layer 703, the electron-transport layer 704, and the electron-injection layer 705.

The hole-injection layer 701 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$) or copper (II) phthalocyanine (abbreviation: CuPc) can also be used.

The following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

High molecular compounds (such as an oligomer, a dendrimer, or a polymer) can be used. As examples of the high molecular compound, the following are given: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacryl amide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT./PSS), or polyaniline/poly(styrenesulfonic acid) (PAni/PSS), can also be used.

In particular, for the hole-injection layer 701, a composite material in which an acceptor substance is added to an organic compound having a high hole-transport property is preferably used. With the use of the composite material in which an acceptor substance is added to a substance having a high hole-transport property, excellent hole injection from the first electrode 103 can be obtained, which results in a reduction in the drive voltage of the light-emitting element. Such a composite material can be formed by co-depositing a substance having a high hole-transport property and a substance having an acceptor property. The hole-injection layer 701 is formed using the composite material, whereby excellent hole injection from the first electrode 103 into the EL layer 102 can be obtained.

As the organic compound for the composite material, any of a variety of compounds such as aromatic amine compounds, carbazole derivatives, aromatic hydrocarbons, and high molecular compounds (e.g., oligomer, dendrimer, and polymer) can be used. The organic compound used for the composite material is preferably an organic compound having a high hole-transport property. Specifically, a substance having a hole mobility of $10^{-6}$ $cm^2/Vs$ or higher is preferably used. Note that any other substances may also be used as long as the hole-transport property thereof is higher than the electron-transport property thereof. The organic compounds that can be used for the composite material will be specifically given below.

Examples of the organic compound that can be used for the composite material include: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD) 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Any of the following aromatic hydrocarbon compounds can be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Any of the following aromatic hydrocarbon compounds can be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

As examples of the electron acceptor, organic compounds such as 7,7,8,8-tetracyano-2,3,5,6-tetrafluoroquinodimethane (abbreviation: $F_4$-TCNQ) and chloranil; and transition metal oxides can be given. Oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is particularly preferable because it is stable in the air, has a low hygroscopic property, and is easily handled.

Note that the composite material may be formed using the above-described electron acceptor and the above high molecular compound such as PVK, PVTPA, PTPDMA, or Poly-TPD and may be used for the hole-injection layer 701.

The hole-transport layer 702 is a layer containing a substance having a high hole-transport property. As the substance having a high hole-transport property, any of the following aromatic amine compounds can be used, for example: NPB; TPD; BPAFLP; 4,4'-bis[N-(9, 9-dimethylfluoren-2-yl)-N-phenylamino]biphenyl (abbreviation: DFLDPBi); and 4,4'-bis[N-(spiro-9,9'-bifluoren-2-yl)-N-phenylamino]biphenyl (abbreviation: BSPB). The substances given here are mainly ones that have a hope mobility of $10^{-6}$ cm$^2$/V·s or higher. Note that any other substances may also be used as long as the hole-transport property thereof is higher than the electron-transport property thereof. Note that the layer containing a substance having a high hole-transport property is not limited to a single layer and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can also be used.

The light-emitting layer 703 is a layer containing a light-emitting organic compound. As the light-emitting organic compound, for example, a fluorescent compound which exhibits fluorescence or a phosphorescent compound which exhibits phosphorescence can be used.

As the fluorescent compound that can be used for the light-emitting layer 703, a material for blue light emission, a material for green light emission, a material for yellow light emission, and a material for red light emission are given. As examples of the material for blue light emission, the following are given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. As examples of the material for green light emission, the following are given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl) phenyl]-N-phenyl anthracen-2-amine (abbreviation: 2YGABPhA), N,N,9-triphenylanthracen-9-amine (abbreviation: DPhAPhA), and the like. As examples of the material for yellow light emission, rubrene, 5,12-bis(1,1'-biphenyl-4-yl)-6,11-diphenyltetracene (abbreviation: BPT), and the like are given. As examples of the material for red light emission, N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like are given.

As the phosphorescent compound that can be used for the light-emitting layer 703, a material for blue light emission, a material for green light emission, a material for yellow light emission, a material for orange light emission, and a material for red light emission are given. As examples of the material for blue light emission, the following are given: bis[2-(4',6'-difluorophenyl)pyridinato-N,C$^{2'}$]iridium(III)tetrakis(1-pyrazolyl)borate (abbreviation: FIr6); bis[2-(4',6'-difluorophenyl)pyridinato-N,C$^{2'}$]iridium(III)picolinate (abbreviation: FIrpic); bis{(2-[3',5'-bis(trifluoromethyl)phenyl]pyridinato-N,C}iridium(III) picolinate (abbreviation: Ir(CF$_3$ppy)$_2$(pic)); bis[2-(4',6'-difluorophenyl)pyridinato-N, C$^{2'}$]iridium(III)acetylacetonate (abbreviation: FIr(acac)); and the like. As examples of the material for green light emission, the following are given: tris(2-phenylpyridinato-N,C$^{2'}$)iridium(III) (abbreviation: Ir(ppy)$_3$), bis[2-phenylpyridinato-N,C$^{2'}$]iridium(III)acetylacetonate (abbreviation: Ir(ppy)$_2$(acac)), bis(1,2-diphenyl-1H-benzimidazolato) iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium (III) (abbreviation: Ir(bzq)$_3$), and the like. As examples of the material for yellow light emission, the following are given: bis(2,4-diphenyl-1,3-oxazolato-N,C$^{2'}$)iridium(III) acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)) (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. As examples of the material for orange light emission, the following are given: tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato) bis(3,5-dimethyl-2-phenylpyrazinato)iridium(III) (abbreviation [Ir(mppr-Me)$_2$(acac)]), (acetylacetonato)bis(5-isopropyl-3-methyl-2-phenylpyrazinato)iridium(III) (abbreviation: Ir(mppr-iPr)$_2$(acac)), and the like. As examples of the material for red light emission, organometallic complexes such as bis[2-(2'-benzo[4,5-α]thienyl) pyridinato-N,C$^{3'}$)iridium(III)acetylacetonate (abbreviation: [Ir(btp)$_2$(acac)]), bis(1-phenylisoquinolinato-N,C$^{2'}$)iridium (III)acetylacetonate (abbreviation: [Ir(piq)$_2$(acac)]), (acetylacetonato)bis[2,3-bis(4-fluorophenyl)quinoxalinato] iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), (dipivaloylmethanato)bis (2,3,5-triphenylpyrazinato)iridium(II) (abbreviation: [Ir (tppr)$_2$(dpm)]), and (2,3,7,8,12,13,17,18-octaethyl-21H, 23H-porphyrin)platinum(II) (abbreviation: PtOEP). In addition, rare-earth metal complexes, such as tris(acetylacetonato)(monophenanthroline)terbium(III) (abbreviation: Tb(acac)$_3$(Phen)), tris(1,3-diphenyl-1,3-propanedionato)

(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

As specific examples of the host material, the following are given: metal complexes such as tris(8-quinolinolato)aluminum(III) (abbreviation: Alq), tris(4-methyl-8-quinolinolato)aluminum(II) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(I) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

Plural kinds of materials can be used as the host material. For example, in order to suppress crystallization, a substance such as rubrene which suppresses crystallization may be further added. In addition, NPB, Alq, or the like may be further added in order to efficiently transfer energy to the guest material.

When the structure in which a guest material is dispersed in a host material is employed, crystallization of the light-emitting layer 703 can be suppressed. In addition, concentration quenching due to high concentration of the guest material can be suppressed.

For the light-emitting layer 703, a high molecular compound can be used. Specifically, a material for blue light emission, a material for green light emission, and a material for orange to red light emission are given. As examples of the material for blue light emission, the following are given: poly(9,9-dioctylfluorene-2,7-diyl) (abbreviation: PFO), poly[(9,9-dioctylfluorene-2,7-diyl-co-(2,5-dimethoxybenzene-1,4-diyl] (abbreviation: PF-DMOP), poly{(9,9-dioctylfluorene-2,7-diyl)-co-[N,N'-di-(p-butylphenyl)-1,4-diaminobenzene]}(abbreviation: TAB-PFH), and the like. As examples of the material for green light emission, the following are given: poly(p-phenylenvinylene) (abbreviation: PPV), poly[(9,9-dihexylfluorene-2,7-diyl)-alt-co-(benzo [2,1,3]thiadiazol-4,7-diyl)](abbreviation: PFBT), poly[(9,9-dioctyl-2,7-divinylenfluorenylene)-alt-co-(2-methoxy-5-(2-ethylhexyloxy)-1, 4-phenylene)], and the like. As examples of the material for orange to red light emission, the following are given: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of light-emitting layers and making emission colors of the light-emitting layers different, light emission having a desired color can be obtained from the light-emitting element as a whole. For example, in the light-emitting element having two light-emitting layers, when an emission color of the first light-emitting layer and an emission color of the second light-emitting layer are made to be complementary colors, it is possible to obtain a light-emitting element from which white light is emitted from the whole light-emitting element. Note that "complementary colors" refer to colors that can produce an achromatic color when mixed. In other words, when lights obtained from substances which emit complementary colors are mixed, white emission can be obtained. This can be applied to a light-emitting element having three or more light-emitting layers.

The electron-transport layer 704 is a layer containing a substance having a high electron-transport property. As examples of the substance having a high electron-transport property, the following are given: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq). A metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can also be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances given here are mainly ones that have an electron mobility of $10^{-6}$ cm$^2$/Vs or higher. Note that the electron-transport layer is not limited to a single layer and may be a stack of two or more layers containing any of the above substances.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an ink-jet method, or a coating method.

Figure 3B:
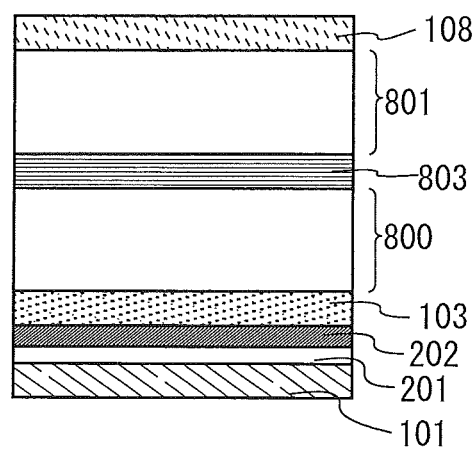

Note that a plurality of EL layers may be stacked between the first electrode 103 and the second electrode 108 as illustrated in FIG. 3B. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer containing the composite material and a layer containing another material. In that case, as the layer containing another material, a layer containing an electron donating substance and a substance having a high electron-transport property, a layer formed of a transparent conductive film, or the like can be used. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. Note that this structure can be combined with any of the above structures of the EL layer.

Further, by forming EL layers to emit light of different colors from each other, a light-emitting element as a whole can provide light emission of a desired color. For example, in a light-emitting element having the two EL layers, the emission colors of the first and second EL layers are complementary, so that the light-emitting element can be made to emit white light as a whole. This can be applied to a light-emitting element having three or more EL layers.

Figure 3C:
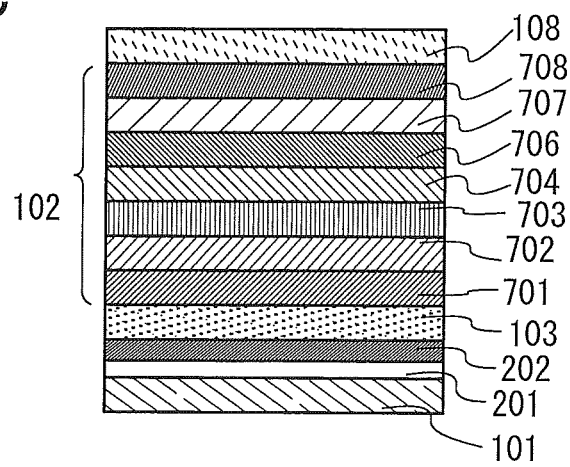

As illustrated in FIG. 3C, the EL layer 102 may include, between the first electrode 103 and the second electrode 108, the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108.

The composite material layer 708 which is in contact with the second electrode 108 is preferably provided, in which case damage caused to the EL layer 102 particularly when the second electrode 108 is formed by a sputtering method can be reduced. The composite material layer 708 can be formed using the above composite material in which an acceptor substance is contained in an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected into the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate). Note that as the substance having a high electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in drive voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, any of CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent, and thus has an advantage of being easily handled during formation of a light-emitting element and an advantage of facilitating maintenance of an apparatus used for film formation.

The electron-relay layer 707 may further contain a donor substance. As the donor substance, any of the following can be used: an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. Specifically, it is preferable to use a substance having a LUMO level of greater than or equal to −5.0 eV, preferably greater than or equal to −5.0 eV and less than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its stability.

As specific examples of the perylene derivative, the following are given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following are given: pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), 2,3-bis(4-fluorophenyl)pyrido[2,3-b]pyrazine (F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl-1,4,5,8-naphthalenetetracarb oxylic diimide (abbreviation: NTCDI-C8F), 3',4'-dibutyl-5,5"-bis(dicyanomethylene)-5, 5"-dihydro-2,2':5',2"-terthiophen) (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may be each formed using any of the above-described materials.

Then, the second electrode 108 is formed over the EL layer 102.

The second electrode 108 is provided opposite to the side where light is extracted and is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given. Further, the above materials are preferable because they are present in large amounts in the Earth's crust and inexpensive to achieve a reduction in manufacturing cost of a light-emitting element.

Lastly, an uneven structure is formed on the surface of the structure body 101 on the side where light is extracted with the use of a microlens array with a refractive index of 1.5.

In the above manner, the organic EL element of this embodiment can be manufactured.

According to one embodiment of the present invention, an element with high light extraction efficiency can be obtained with the reduced use amount of high refractive index material.

(Embodiment 3)

In this embodiment, examples of a lighting device including a light-emitting device including a solid-state light-emitting element of one embodiment of the present invention will be described with reference to FIGS. 4A and 4B.

Figure 4A:
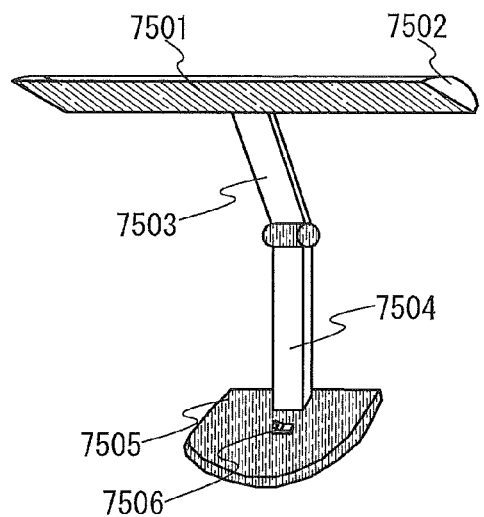
FIGS. 4A and 4B illustrate examples of a lighting device according to Embodiment.

FIG. 4A illustrates a lighting device (desk lamp), which includes a lighting portion 7501, a shade 7502, an adjustable arm 7503, a support 7504, a base 7505, and a power switch 7506. Note that the lighting device is manufactured by using a light-emitting device, which is manufactured according to one embodiment of the present invention, for the lighting portion 7501. Note that the lighting device includes, in its category, ceiling lights (ceiling-fixed lighting devices), wall lights (wall-hanging lighting devices), and the like in addition to the desk lamp illustrated in FIG. 4A.

Note that by using the light-emitting device, to which one embodiment of the present invention is applied, for the lighting portion 7501 of the lighting device (desk lamp), a lighting device (desk lamp) that has high power efficiency and light extraction efficiency and emits light uniformly in a plane can be provided.

Figure 4B:
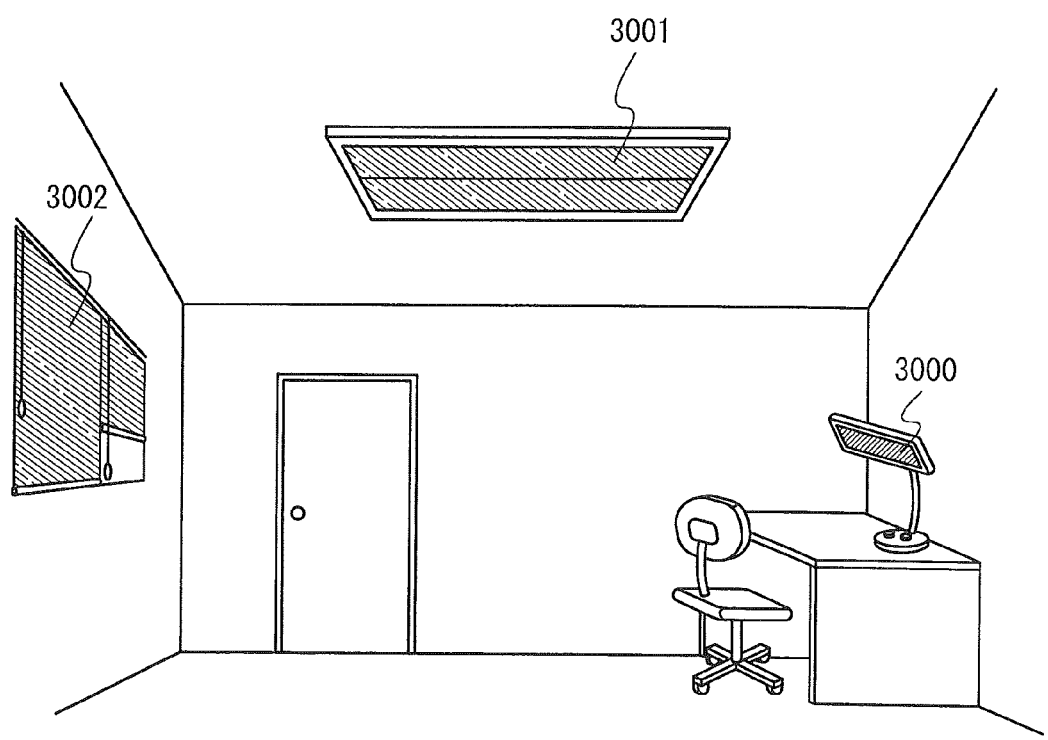

FIG. 4B illustrates an example in which a light-emitting device, to which one embodiment of the present invention is applied, is used for an interior lighting device. The light-emitting device of one embodiment of the present invention is advantageous in increasing the area, and thus can be used as a lighting device having a large area as illustrated by a ceiling light 3001. In addition, the light-emitting device can be used for a wall-hanging lighting device 3002. Note that by using the light-emitting device to which one embodiment of the present invention is applied, a lighting device that has high power efficiency and high light extraction efficiency and emits light uniformly in a plane can be provided. As illustrated in FIG. 4B, a desk lamp 3000 illustrated in FIG. 4A may also be used in a room provided with the interior lighting device.

EXAMPLE 1

In this example, light extraction efficiency of a solid-state light-emitting element of one embodiment of the present invention was obtained by calculation.

In this example, LightTools 7.1 SRI (produced by Cybernet Systems, Co., Ltd.) that is illumination design analysis software was used for the calculation.

Structures of the solid-state light-emitting elements used in this example will be described below with reference to FIGS. 5A to 5D. In this example, an organic EL element was used as the solid-state light-emitting element.

CONVENTIONAL EXAMPLE 1

Figure 5A:
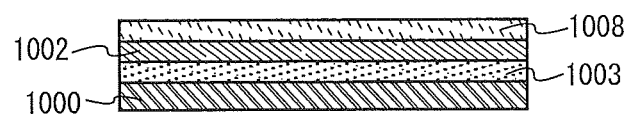
FIGS. 5A to 5D illustrate examples of an organic EL element according to Example.

In an organic EL element of Conventional Example 1 which is illustrated in FIG. 5A, a first electrode 1003 formed of indium tin oxide (ITO), an EL layer 1002 containing a light-emitting substance, and a second electrode 1008 formed of aluminum are stacked in this order over a glass substrate 1000.

The conditions for the calculation are as follows. The refractive indexes of the glass substrate, the first electrode, and the EL layer were 1.5, 2.0, and 1.78, respectively. The transmittance of the first electrode was 90%, the area of a light-emitting region of the EL layer was 60 μm/square, the emission wavelength of the EL layer was 550 nm, and the reflectance of the second electrode was 90%.

CONVENTIONAL EXAMPLE 2

Figure 5B:
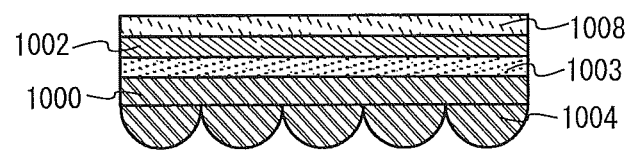
Figure 5C:
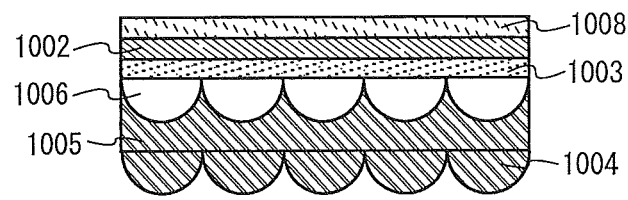
Figure 5D:
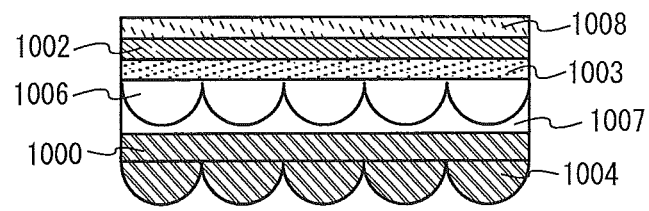

In an organic EL element of Conventional Example 2 which is illustrated in FIG. 5B, in addition to the structure of Conventional Example 1, a hemispherical microlens 1004 with a refractive index of 1.5 was provided on the surface of the glass substrate 1000 on which the electrode or the EL layer 1002 was not formed. The diameter of the hemisphere was 30 μm.

STRUCTURAL EXAMPLE 1

In Structural Example 1 (FIG. 5C) that is an organic EL element of one embodiment of the present invention, in addition to the structure of Conventional Example 2, a high refractive index material layer 1006 was provided between a glass substrate 1005 and the first electrode 1003. The refractive index of the high refractive index material layer 1006 was 1.8. Further, the glass substrate 1005 was provided with a hemispherical uneven structure on its surface in contact with the high refractive index material layer 1006. The diameter of the hemisphere was 30 μm.

STRUCTURAL EXAMPLE 2

In Structural Example 2 (FIG. 5D) that is an organic EL element of one embodiment of the present invention, in addition to the structure of Conventional Example 2, a low refractive index material layer 1007 and the high refractive index material layer 1006 were provided in this order from the glass substrate 1000 side between the glass substrate 1000 and the first electrode 1003. The refractive indexes of the low refractive index material layer 1007 and the high refractive index material layer 1006 were 1.36 and 1.8, respectively. Further, a structure was employed in which a hemispherical uneven structure was provided at the interface between the low refractive index material layer 1007 and the high refractive index material layer 1006. The diameter of the hemisphere was 30 μm.

Table 1 shows the light extraction efficiency of each element which was obtained from the calculation and the ratio of the light extraction efficiency of each of Conventional Example 2, Structural Example 1, and Structural Example 2 to a light extraction efficiency of Conventional Example 1 of 1.

TABLE 1

|  | Light Extraction Efficiency (%) | Ratio to Conventional Example 1 |
| --- | --- | --- |
| Conventional Example 1 | 16.8 | 1 |
| Conventional Example 2 | 33.3 | 1.98 |
| Structural Example 1 | 44.9 | 2.67 |
| Structural Example 2 | 53.3 | 3.17 |

As shown in Table 1, the light extraction efficiency of Structural Example 1 and Structural Example 2 were higher than that of Conventional Example 1 and Conventional Example 2.

Further, Structural Example 2 had the highest light extraction efficiency. The Structural Example 2 includes the low refractive index material layer 1007 that is a layer with a refractive index lower than that of the glass substrate 1000 between the high refractive index material layer 1006 and the glass substrate 1000. The reason why Structural Example 2 had the highest light extraction efficiency is that loss of light due to total refection at the interface between the low refractive index material layer 1007 and the glass substrate 1000, or the like was able to be reduced, which resulted in an increase in the light extraction efficiency.

The above results indicate that application of one embodiment of the present invention makes it possible to realize a solid-state light-emitting element which is inexpensive and has high light extraction efficiency.

EXAMPLE 2

In this example, solid-state light-emitting elements of one embodiment of the present invention will be described with reference to FIGS. 6A to 6D. All the solid-state light-emitting elements in this example are organic EL elements. Chemical formulae of materials used in this example are shown below.

[Chemical Formulae 1]

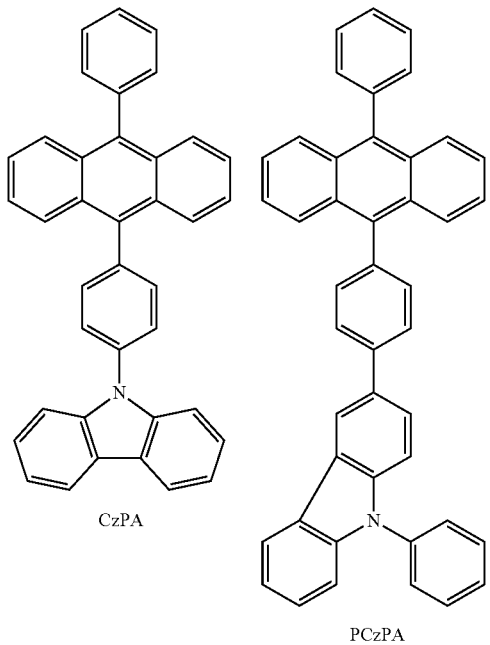

CzPA

PCzPA

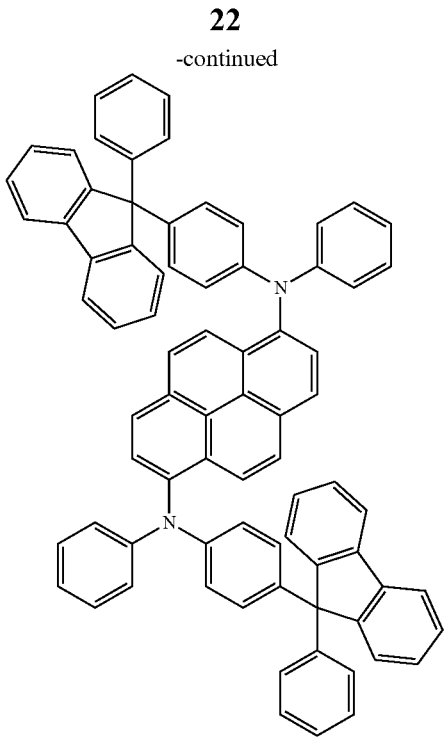

1,6FLPAPm

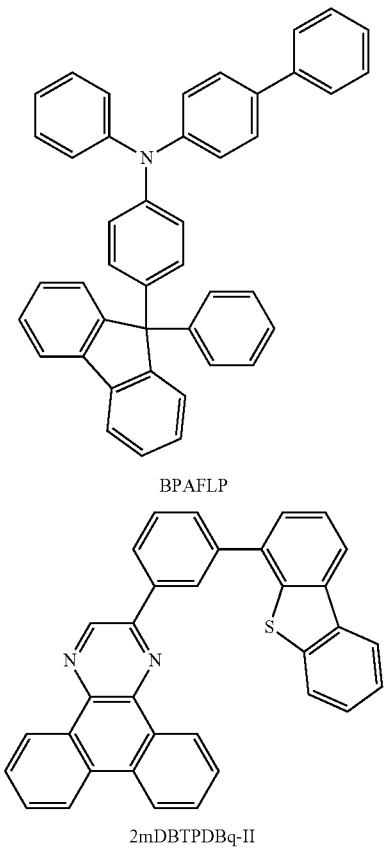

BPAFLP

2mDBTPDBq-II

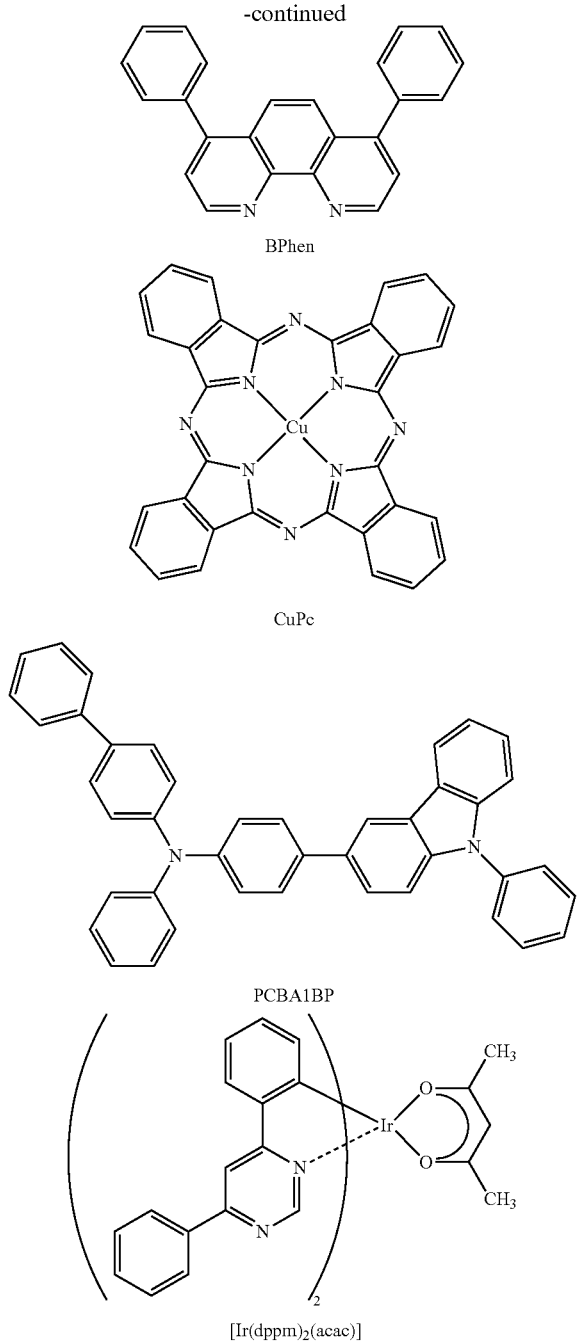

In this example, a light-emitting element 1, a light-emitting element 2, and a comparative light-emitting element 3 were manufactured.

The light-emitting element 1 (FIG. 6A) and the light-emitting element 2 (FIG. 6B) each of which is one embodiment of the present invention include a structure body 101. In addition, a high refractive index material layer 201 is formed over the structure body 101, and a light-emitting body 301 is formed over the high refractive index material layer 201.

Figure 6A:
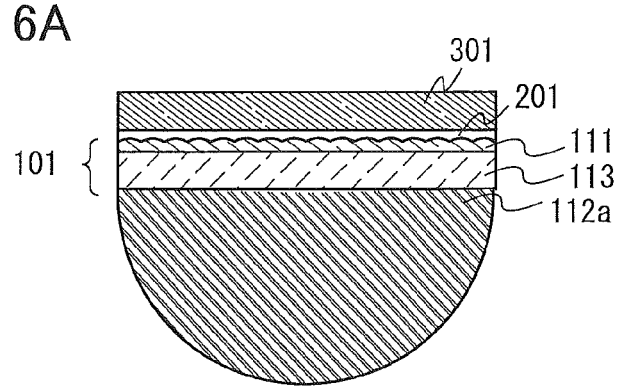
FIGS. 6A to 6D illustrate examples of a solid-state light-emitting element according to Example.

In the structure body 101 of the light-emitting element 1 illustrated in FIG. 6A, a first layer 111, a third layer 113, and a second layer 112a are provided from the high refractive index material layer 201 side. The first layer 111 is formed of a microlens array with a pitch of 6 μm (refractive index: about 1.5). The third layer 113 is formed of glass with a thickness of 0.7 mm (refractive index: about 1.48). The second layer 112a is formed of a hemispherical lens (refractive index: about 1.5). Note that the third layer 113 and the second layer 112a are in contact with each other with a light-transmitting resin (refractive index: about 1.5) therebetween.

Figure 6B:
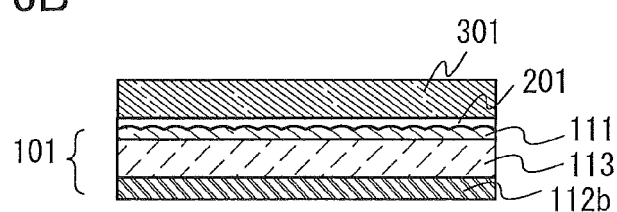

In the structure body 101 of the light-emitting element 2 illustrated in FIG. 6B, the first layer 111, the third layer 113, and a second layer 112b are provided from the high refractive index material layer 201 side. The first layer 111 is formed of a microlens array with a pitch of 6 μm (refractive index: about 1.5). The third layer 113 is formed of glass with a thickness of 0.7 mm (refractive index: about 1.48). The second layer 112b is formed of a lens diffusion plate (refractive index: about 1.5). Note that the third layer 113 and the second layer 112b are in contact with each other with a light-transmitting resin (refractive index: about 1.5) therebetween.

Figure 6C:
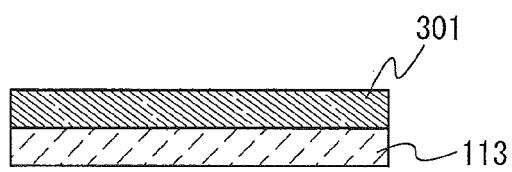

In the comparative light-emitting element 3 that is a conventional example, the light-emitting body 301 is formed over the third layer 113 (FIG. 6C). The third layer 113 is formed of glass with a thickness of 0.7 mm (refractive index: about 1.48).

A specific manufacturing method will be described below.
(Light-emitting Element 1)

First, a microlens array with a refractive index of about 1.5 was formed over glass with a refractive index of about 1.48 (EAGLE XG® produced by Corning Incorporated) with the use of a mold. The microlens array was formed using OPTOKLEB HS226 containing epoxy methacrylate as its main component (produced by ADELL Corporation). As described above, the pitch of the microlens array was 6 μm.

Next, a high refractive index resin (with a thickness of about 10 nm) was applied on the microlens array with a bar coater and then is cured by being irradiated with ultraviolet light (wavelength: 365 nm) at greater than or equal to 90 mW/cm² for one minute, so that the high refractive index material layer 201 was formed. Note that a UV curable functional hard coating agent, LIODURAS® TYT 80-01 (produced by TOYO INK CO., LTD) with a refractive index of about 1.8, was used as the high refractive index resin.

After that, the light-emitting body 301 was formed over the high refractive index material layer 201. A specific manufacturing method of the light-emitting body 301 will be described later.

After the light-emitting body 301 was formed, the hemispherical lens with a refractive index of about 1.5 was provided on the surface of the glass on the side where the light-emitting body 301 is not formed and at a position overlapping with a light-emitting region of the light-emitting body 301, with the light-transmitting resin with a refractive index of about 1.5 therebetween. Note that Aspheric Condenser Lens 35×26.2 FL (produced by Edmund Optics Japan Co., Ltd.) was used as the hemispherical lens. In addition, ELC-2500 Clear (produced by Electro-Lite Corporation) was used as the light-transmitting resin.
(Light-emitting Element 2)

First, the first layer 111, the third layer 113, the high refractive index material layer 201, and the light-emitting body 301 were each formed using a material and a method similar to those of the light-emitting element 1.

After the light-emitting body 301 was formed, the lens diffusion plate with a refractive index of about 1.5 was provided on the surface of the glass on the side where the light-emitting body 301 was not formed and at a position overlapping with a light-emitting region of the light-emitting body 301, with the light-transmitting resin with a refractive index of about 1.5 therebetween. As the lens diffusion plate, LSD60PC10-F12 (produced by Optical Solutions Corporation) was used. In addition, ELC-2500 Clear (produced by Electro-Lite Corporation) was used as the light-transmitting resin.

(Comparative Light-emitting Element 3)

The light-emitting body 301 was formed over the third layer 113, so that the comparative light-emitting element 3 was manufactured. As the third layer 113, glass with a refractive index of about 1.48 (EAGLE XG® produced by Corning Incorporated) was used. The light-emitting body 301 was formed by a method similar to that of the light-emitting element 1.

Figure 6D:
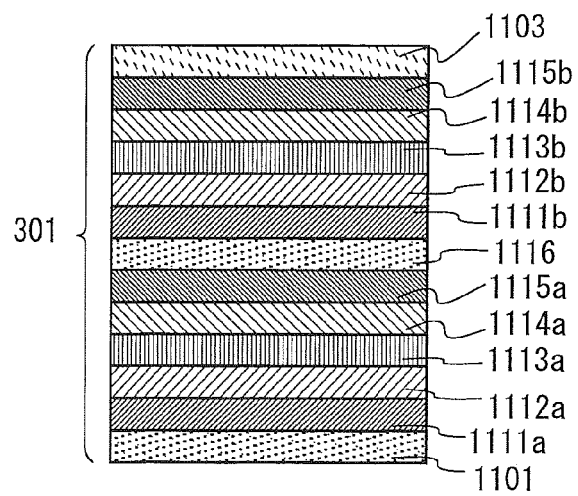

A manufacturing method of the light-emitting body 301 included in the light-emitting element 1, the light-emitting element 2, and the comparative light-emitting element 3 will be described below with reference to FIG. 6D.

<Manufacturing Method of Light-emitting Body 301>

Indium tin oxide containing silicon oxide (ITSO) was deposited by a sputtering method, so that a first electrode 1101 serving as an anode was formed. Note that the thickness of the first electrode 1101 was 110 nm and the area thereof was 2 mm×2 mm.

Next, the substrate 1100 was fixed to a substrate holder in a vacuum evaporation apparatus so that a surface of the substrate 1100 on which the first electrode 1101 was formed faced downward. The pressure in the vacuum evaporation apparatus was reduced to about $10^{-4}$ Pa. Then, 9-phenyl-3-[4-(10-phenyl-9-anthryl)phenyl]-9H-carbazole (abbreviation: PCzPA) and molybdenum(VI) oxide were co-evaporated on the first electrode 1101 to form a first hole-injection layer 1111a. The thickness of the first hole-injection layer 1111a was 50 rm. The weight ratio of PCzPA to molybdenum(VI) oxide was adjusted to be 2:1 (=PCzPA:molybdenum oxide). Note that the co-evaporation method refers to an evaporation method in which evaporation is carried out from a plurality of evaporation sources at the same time in one treatment chamber.

Next, PCzPA was deposited to a thickness of 30 nm on the first hole-injection layer 1111a, so that a first hole-transport layer 1112a was formed.

Furthermore, 9-[4-(N-carbazolyl)]phenyl-10-phenylanthracene (abbreviation: CzPA) and N,N-bis[4-(9-phenyl-9H-fluoren-9-yl)phenyl]-N,N'-diphenylpyrene-1,6-diamine (abbreviation: 1,6FLPAPrn) were co-evaporated on the first hole-transport layer 1112a, so that a first light-emitting layer 1113a was formed. The thickness of the first light-emitting layer 1113a was 30 nm. The weight ratio of CzPA to 1,6FLPAPrn was adjusted to be 1:0.05 (=CzPA:1,6FLPAPrn).

Next, on the first light-emitting layer 1113a, CzPA was deposited to a thickness of 5 nm and bathophenanthroline (abbreviation: BPhen) was deposited to a thickness of 15 nm, so that a first electron-transport layer 1114a was formed.

After that, 0.1-nm-thick Li was formed on the first electron-transport layer 1114a by evaporation, so that a first electron-injection layer 1115a was formed.

After that, 2-nm-thick copper phthalocyanine (abbreviation: CuPc) was formed on the first electron-injection layer 1115a by evaporation, so that an electron relay layer 1116 was formed.

Next, on the electron-relay layer 1116, 4-phenyl-4'-(9-phenylfluoren-9-yl)triphenylamine (abbreviation: BPAFLP) and molybdenum(VI) oxide were co-evaporated, so that a second hole-injection layer 1111b was formed. The thickness of the second hole-injection layer 1111b was 60 nm. The weight ratio of BPAFLP to molybdenum(VI) oxide was adjusted to be 2:1 (=BPAFLP:molybdenum oxide). Note that the second hole-injection layer 1111b of this example functions as the charge generation layer described in the above embodiment.

Next, BPAFLP was deposited to a thickness of 20 nm on the second hole-injection layer 1111b, so that a second hole-transport layer 1112b was formed.

After that, on the second hole-transport layer 1112b, 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(4,6-diphenylpyrimidinato)iridium (III) (abbreviation: [Ir(dppm)$_2$(acac)]) were co-evaporated, so that a second light-emitting layer 1113b was formed. The thickness of the second light-emitting layer 1113b was 40 nm. The weight ratio of 2mDBTPDBq-II to PCBA1BP and Ir(dppm)$_2$(acac) was adjusted to be 1.6:0.4:0.12 (=2mDBT-PDBq-II:PCBA1BP:Ir(dppm)$_2$(acac)).

Next, on the second light-emitting layer 1113b, 2mDBT-PDBq-II and BPhen were each deposited to a thickness of 15 nm, so that a second electron-transport layer 1114b was formed.

After that, 1-nm-thick lithium fluoride (LiF) was formed on the second electron-transport layer 1114b by evaporation, so that a second electron-injection layer 1115b was formed.

After that, as a second electrode 1103 serving as a cathode, 200-nm-thick aluminum was formed on the second electron-injection layer 1115b by evaporation.

Lastly, the light-emitting element was sealed in a glove box under a nitrogen atmosphere so that the light-emitting element was not exposed to the air.

Note that, in the above evaporation steps, evaporation was all performed by a resistance heating method.

Table 2 shows element structure of the organic EL element that was the light-emitting body 301 and was manufactured through the above steps.

TABLE 2

| first electrode |
|---|
| ITSO 110 nm |

| first hole-injection layer | first hole-transport layer | first light-emitting layer | first electron-transport layer | | first electron-injection layer | electron-relay layer |
|---|---|---|---|---|---|---|
| PCzPA:MoOx (=2:1) 50 nm | PCzPA 30 nm | CzPA:1,6FLPAPrn (=1:0.05) 30 nm | CzPA 5 nm | BPhen 15 nm | Li 0.1 nm | CuPc 2 nm |

TABLE 2-continued

| second hole-injection layer | second hole-transport layer | second light-emitting layer | second electron-transport layer | second electron-injection layer | second electrode |
|---|---|---|---|---|---|
| BPAFLP:MoOx (=2:1) 60 nm | BPAFLP 20 nm | 2mDBTPDBq-II: PCBA1BP:Ir(dppm)$_2$(acac) (=1.6:0.4:0.12) 40 nm | 2mDBTPDBq-II 15 nm | BPhen 15 nm | LiF 1 nm | Al 200 nm |

Table 3 shows the relative power efficiency of the light-emitting element 1, the light-emitting element 2, and the comparative light-emitting element 3 that are obtained as described above. The relative power efficiency shown in Table 3 is shown as comparative values in the case where the power efficiency of the comparative light-emitting element 3 is 1.

TABLE 3

|  | Relative Power Efficiency |
|---|---|
| Light-emitting Element 1 | 1.92 |
| Light-emitting Element 2 | 1.34 |
| Comparative Light-emitting Element 3 | 1 |

According to Table 3, the relative power efficiency of the light-emitting element 1 and the light-emitting element 2 to each of which one embodiment of the present invention was applied was as high as 1.92 and 1.34, respectively, as compared to the comparative light-emitting element 3 that is a conventional example.

The results of this example show that application of one embodiment of the present invention makes it possible to obtain a solid-state light-emitting element with high power efficiency.

REFERENCE EXAMPLE 1

A sysnthesis method of 2-[3-(dibenzothiophen-4-yl)phenyl]dibenzo[f,h]quinoxaline (abbreviation: 2mDBTPDBq-II) used in the above example will be described.

[Chemical Formula 2]

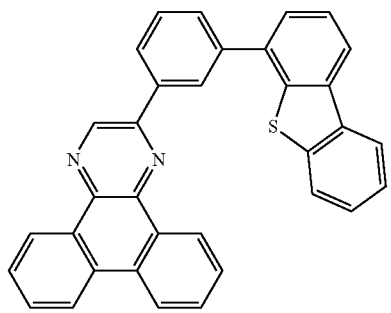

2mDBTPDBq-II

A synthesis scheme of 2mDBTPDBq-II is shown in (A-1).

[Chemical Formulae 3]

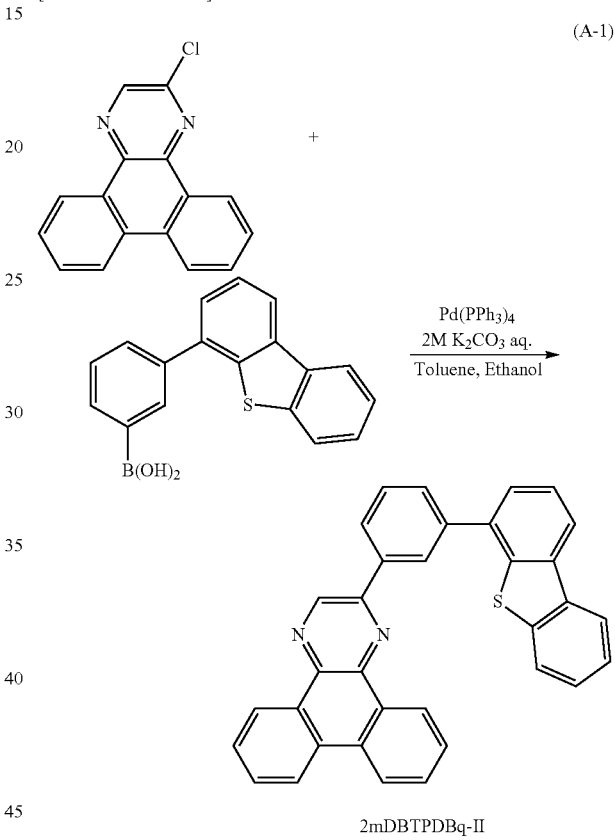

2mDBTPDBq-II

In a 2 L three-neck flask were put 5.3 g (20 mmol) of 2-chlorodibenzo[f,h]quinoxaline, 6.1 g (20 mmol) of 3-(dibenzothiophen-4-yl)phenylboronic acid, 460 mg (0.4 mmol) of tetrakis(triphenylphosphine)palladium(0), 300 mL of toluene, 20 mL of ethanol, and 20 mL of 2M potassium carbonate aqueous solution. The mixture was degassed by being stirred under reduced pressure, and the air in the flask was replaced with nitrogen. This mixture was stirred under a nitrogen stream at 100° C. for 7.5 hours. After cooling to room temperature, the obtained mixture was filtered to give a white substance. The obtained substance by the filtration was washed with water and ethanol in this order, and then dried. The obtained solid was dissolved in about 600 mL of hot toluene, followed by suction filtration through Celite (produced by Wako Pure Chemical Industries, Ltd., Catalog No. 531-16855) and Florisil (produced by Wako Pure Chemical Industries, Ltd., Catalog No. 540-00135), whereby a clear colorless filtrate was obtained. The obtained filtrate was concentrated and purified by silica gel column chromatography. The chromatography was carried out using hot toluene as a developing solvent. Acetone and ethanol were added to the solid obtained here, followed by irradiation with ultrasonic waves. Then, the generated suspended solid was filtered and the obtained solid was dried to give 7.85 g of a white powder in a yield of 80%.

By a train sublimation method, 4.0 g of the obtained white powder was purified. In the purification, the white powder was heated at 300° C. under a pressure of 5.0 Pa with a flow rate of argon of 5 mL/min. After the purification, 3.5 g of a white powder that was an objective substance was obtained in a yield of 88%.

A nuclear magnetic resonance (NMR) method identified this compound as 2-[3-(dibenzothiophen-4-yl)phenyl] dibenzo[f,h]quinoxaline (abbreviation: 2mDBTPDBq-II), which was the substance to be produced.

$^1$H NMR data of the obtained substance are as follows: $^1$H NMR (CDCl$_3$, 300 MHz): δ (ppm)=7.45-7.52 (m, 2H), 7.59-7.65 (m, 2H), 7.71-7.91 (m, 7H), 8.20-8.25 (m, 2H), 8.41 (d, J=7.8 Hz, 1H), 8.65 (d, J=7.5 Hz, 2H), 8.77-8.78 (m, 1H), 9.23 (dd, J=7.2 Hz, 1.5 Hz, 1H), 9.42 (dd, J=7.8 Hz, 1.5 Hz, 1H), 9.48 (s, 1H).

REFERENCE EXAMPLE 2

A synthesis method of (acetylacetonato)bis(4,6-diphenylpyrimidinato)iridium(III) (abbreviation: [Ir(dppm)$_2$(acac)]) used in the above example will be described.

[Chemical Formula 4]

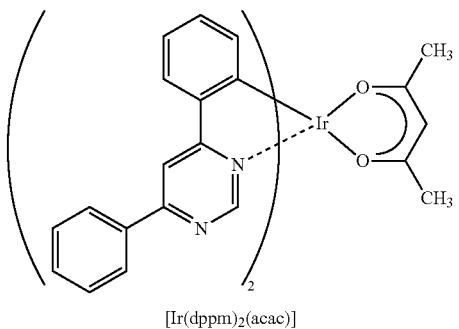

[Ir(dppm)$_2$(acac)]

Step 1: Synthesis of 4,6-diphenylpyrimidine (abbreviation: Hdppm)

First, in a recovery flask equipped with a reflux pipe were put 5.02 g of 4,6-dichloropyrimidine, 8.29 g of phenylboronic acid, 7.19 g of sodium carbonate, 0.29 g of bis(triphenylphosphine)palladium(II)dichloride (abbreviation: Pd(PPh$_3$)$_2$Cl$_2$), 20 mL of water, and 20 mL of acetonitrile, and the air in the flask was replaced with argon. This reaction container was subjected to irradiation with microwaves (2.45 GHz, 100 W) for one hour to be heated. Here, in the flask were further put 2.08 g of phenylboronic acid, 1.79 g of sodium carbonate, 0.070 g of Pd(PPh$_3$)$_2$Cl$_2$, 5 mL of water, and 5 mL of acetonitrile, and the mixed solution was subjected to irradiation with microwaves (2.45 GHz, 100 W) for one hour to be heated. After that, water was added to this solution and an organic layer was extracted with dichloromethane. The obtained extract was washed with water and dried with magnesium sulfate. After the drying, the solution was filtrated. The solvent of this solution was distilled off, and then the obtained residue was purified by silica gel column chromatography using dichloromethane as a developing solvent. As a result, a pyrimidine derivative Hdppm (yellow white powder, yield of 38%) was obtained. Note that for the microwave irradiation, a microwave syn-thesis system (Discovery, produced by CEM Corporation) was used. A synthesis scheme (B-1) of Step 1 is shown below.

[Chemical Formulae 5]

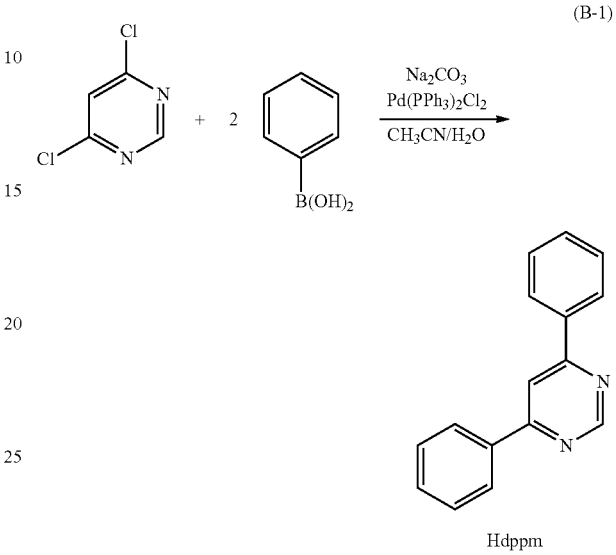

Step 2: Synthesis of di-μ-chloro-bis[bis(4,6-diphenylpyrimidinato)iridium(III)](abbreviation: [Ir(dppm)$_2$Cl]$_2$)

Next, in a recovery flask equipped with a reflux pipe were put 15 mL of 2-ethoxyethanol, 5 mL of water, 1.10 g of Hdppm obtained in Step 1, and 0.69 g of iridium chloride hydrate (IrCl$_3$.H$_2$O), and the air in the flask was replaced with argon. After that, irradiation with microwaves (2.45 GHz, 100 W) was performed for one hour to cause a reaction. After the solvent was distilled off, and the obtained residue was filtered with ethanol and washed to give a dinuclear complex [Ir(dppm)$_2$Cl]$_2$ was obtained (reddish brown powder, yield of 88%). A synthesis scheme (B-2) of Step 2 is shown below.

[Chemical Formulae 6]

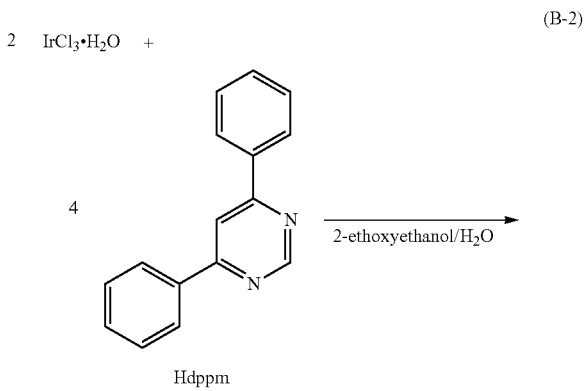

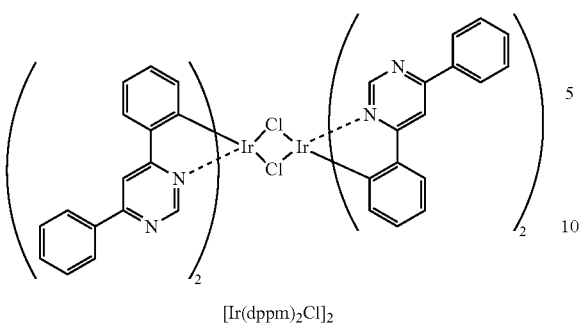

[Ir(dppm)₂Cl]₂

Step 3: Synthesis of (acetylacetonato)bis(4,6-diphenylpyrimidinato)iridium(III) (abbreviation: [Ir(dppm)₂(acac)])

Furthermore, in a recovery flask equipped with a reflux pipe were put 40 mL of 2-ethoxyethanol, 1.44 g of [Ir(dppm)₂Cl]₂ obtained in Step 2, 0.30 g of acetylacetone, and 1.07 g of sodium carbonate, and the air in the flask was replaced with argon. After that, irradiation with microwaves (2.45 GHz, 120 W) was performed for one hour to cause a reaction. The solvent was distilled off, the obtained residue was dissolved in dichloromethane, and filtration was performed to remove insoluble matter. The obtained filtrate was washed with water and then with saturated saline, and was dried with magnesium sulfate. After the drying, the solution was filtrated. The solvent of this solution was distilled off, and then the obtained residue was purified by silica gel column chromatography using dichloromethane and ethyl acetate as a developing solvent in a volume ratio of 50:1. After that, recrystallization was carried out with a mixed solvent of dichloromethane and hexane to give orange powder that was an objective substance (yield of 32%). A synthesis scheme (B-3) of Step 3 is shown below.

[Chemical Formulae 7]

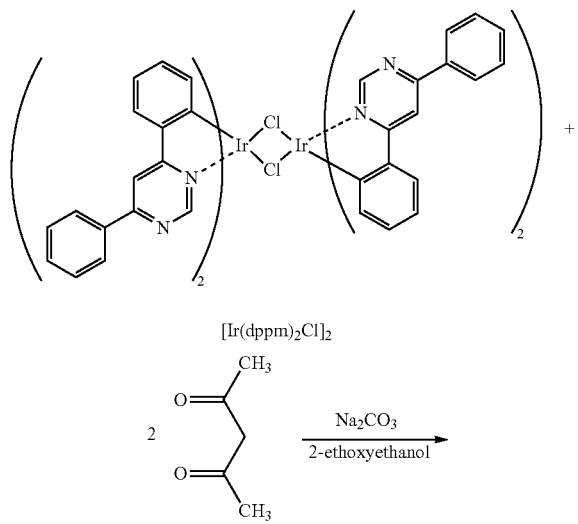

(B-3)

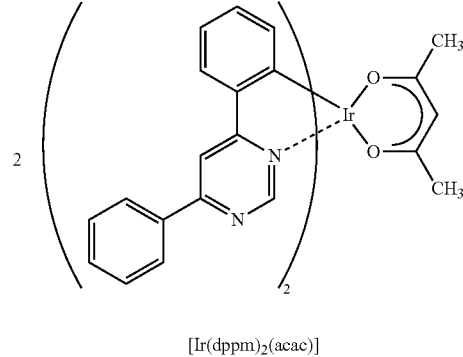

[Ir(dppm)₂(acac)]

The analysis results by nuclear magnetic resonance spectrometry (¹H-NMR) of the orange powder obtained in Step 3 are shown below. The results show that [Ir(dppm)₂(acac)] was obtained in this synthesis example.

¹H-NMR. δ (CDCl₃): 1.83 (s, 6H), 5.29 (s, 1H), 6.48 (d, 2H), 6.80 (t, 2H), 6.90 (t, 2H), 7.55-7.63 (m 6H), 7.77 (d, 2H), 8.17 (s, 2H), 8.24 (d, 4H), 9.17 (s, 2H).

This application is based on Japanese Patent Application serial no. 2010-205790 filed with Japan Patent Office on Sep. 14, 2010, the entire contents of which are hereby incorporated by reference.

What is claimed is:

1. A solid-state light-emitting element comprising:
a structure body configured to transmit visible light, the structure body including a first surface and a second surface opposite to the first surface;
a layer over the first surface of the structure body, the layer having a refractive index higher than that of the structure body; and
a light-emitting body over the layer,
wherein the first surface includes a first hemispherical pattern,
wherein the second surface includes a second hemispherical pattern,
wherein a pitch of the first hemispherical pattern is different from a pitch of the second hemispherical pattern, and
wherein the first hemispherical pattern includes a micro lens array.

2. The solid-state light-emitting element according to claim 1, wherein the second hemispherical pattern includes a hemispherical lens.

3. The solid-state light-emitting element according to claim 1, wherein the micro lens array is over a glass substrate.

4. The solid-state light-emitting element according to claim 1,
wherein the structure body comprises a first layer and a second layer, and
wherein the first surface is a top surface of the first layer and the second surface is a bottom surface of the second layer.

5. The solid-state light-emitting element according to claim 1, wherein the light-emitting body is a light-emitting diode, an organic EL element, or an inorganic EL element.

6. The solid-state light-emitting element according to claim 1,
wherein the light-emitting body is an organic EL element comprising an electron-relay layer, and wherein the electron-relay layer comprises a nitrogen-containing condensed aromatic compound.

7. The solid-state light-emitting element according to claim 1, wherein the layer contains glass, liquid, or resin.

8. The solid-state light-emitting element according to claim 1, further comprising a nitride film over the light-emitting body.

9. A lighting device comprising the solid-state light-emitting element according to claim 1.

10. A solid-state light-emitting element comprising:
a structure body configured to transmit visible light, the structure body including a first surface and a second surface opposite to the first surface;
a layer over the first surface of the structure body, the layer having a refractive index higher than that of the structure body; and
a light-emitting body over the layer,
wherein the first surface includes a first hemispherical pattern,
wherein the second surface includes a second hemispherical pattern,
wherein a pitch of the first hemispherical pattern is narrower than a pitch of the second hemispherical pattern, and
wherein the first hemispherical pattern includes a micro lens array.

11. The solid-state light-emitting element according to claim 10, wherein the second hemispherical pattern includes a hemispherical lens.

12. The solid-state light-emitting element according to claim 10, wherein the micro lens array is over a glass substrate.

13. The solid-state light-emitting element according to claim 10,
wherein the structure body comprises a first layer and a second layer, and
wherein the first surface is a top surface of the first layer and the second surface is a bottom surface of the second layer.

14. The solid-state light-emitting element according to claim 10, wherein the light-emitting body is a light-emitting diode, an organic EL element, or an inorganic EL element.

15. The solid-state light-emitting element according to claim 10,
wherein the light-emitting body is an organic EL element comprising an electron-relay layer, and
wherein the electron-relay layer comprises a nitrogen-containing condensed aromatic compound.

16. The solid-state light-emitting element according to claim 10, wherein the layer contains glass, liquid, or resin.

17. The solid-state light-emitting element according to claim 10, further comprising a nitride film over the light-emitting body.

18. A lighting device comprising the solid-state light-emitting element according to claim 10.

* * * * *